United States Patent [19]

Takekoshi

[11] Patent Number: 5,604,990
[45] Date of Patent: Feb. 25, 1997

[54] PRINTING PLATE DRYING APPARATUS

[75] Inventor: Tomoaki Takekoshi, Shizuoka, Japan

[73] Assignee: Fuji Photo Film Co., Ltd., Kanagawa, Japan

[21] Appl. No.: 483,274

[22] Filed: Jun. 7, 1995

[30] Foreign Application Priority Data

Jun. 8, 1994 [JP] Japan .................................. 6-126478

[51] Int. Cl.⁶ .................................................. F26B 19/00
[52] U.S. Cl. .................................... 34/68; 34/69; 34/95.3; 34/423
[58] Field of Search ................................ 34/69, 95, 95.3, 34/68, 419, 420, 421, 422, 423

[56] References Cited

U.S. PATENT DOCUMENTS

| | | | |
|---|---|---|---|
| 4,117,604 | 10/1978 | Burg et al. | 34/70 |
| 4,129,919 | 12/1978 | Fitch et al. | 15/302 |
| 5,079,853 | 1/1992 | Kurokawa | 34/60 |
| 5,352,558 | 10/1994 | Simms et al. | 430/125 |
| 5,404,209 | 4/1995 | Matsuoka et al. | 355/256 |

*Primary Examiner*—Henry A. Bennett
*Assistant Examiner*—Dinnatia Doster
*Attorney, Agent, or Firm*—Sughrue, Mion, Zinn, Macpeak & Seas

[57] ABSTRACT

The printing plate drying apparatus includes carrying devices such as flower pattern comb rollers which carry a printing plate having a printing surface including an image-formed portion and a non-image-formed portion, the printing surface being applied with a coating solution; first warm air duct which blows warm air to dry the printing surface of the printing plate on which the coating solution is applied; first solution-absorbing roller which touches the printing surface of the printing plate dried by the first warm air duct to absorb the solution therefrom; and second warm air duct which blows warm air to dry the printing surface of the printing plate which the solution is absorbed by the first solution-absorbing roller.

10 Claims, 6 Drawing Sheets

PRINTING PLATE DRYING APPARATUS

BACKGROUND OF THE INVENTION

1. Field of the Invention

The present invention relates to a drying apparatus for drying a coating solution applied onto a plate surface of a printing plate and, particularly, relates to a printing plate drying technique preferably adapted to a process of applying a treating solution such as a protective gum solution and succeedingly drying the protective gum solution while carrying a sheet-like printing plate in which a plate surface is rinsed with a rinsing solution after a non-image portion is dissolved and removed with an alkaline treating solution (developer).

2. Description of the Related Art

At the present time, a photosensitive planographic printing plate abbreviated as PS plate is used widely for printing characters, images, etc. For formation of characters, images, etc. on such a photosensitive planographic printing plate, there are known: a method in which a silver-salt photographic film negative plate having an image, or the like, recorded in advance is exposed while brought into contact with a photosensitive surface of the printing plate; and further, a method in which an image is formed by using an electrophotographic technique.

The photosensitive planographic printing plate having an image formed thereon is used as a printing plate after a photosensitive layer in a non-image portion is dissolved and removed with a developer. An example of a treating process thereof will be described with reference to FIGS. 5 to 10.

That is, the sheet-like photosensitive planographic printing plate 1 having an image formed by an electrophotographic technique is carried by rollers in a direction shown by the arrow X. A developing zone A, a rinsing zone B and a gum solution applying zone C are provided along the direction of the carrying of the photosensitive planographic printing plate 1. A drying apparatus D is provided on the downstream side of the gum solution applying zone C.

The developing zone A is provided for applying a developer onto the photosensitive planographic printing plate 1 to dissolve and remove the photosensitive layer of the non-image portion, and it is constituted by two pairs of carrying rollers 2a and 2b, a comb pattern roller 9, spray nozzles 3 for spraying the developer, a developer tank 4, a pump P1 for sucking up the developer stored in the developer tank 4 to thereby supply the pressurized developer to the spray nozzles 3, a piping system 5, a brush roller 40 slidably touching the image surface of the photosensitive planographic printing plate 1 and rotating in a forward direction or in a backward direction, and the like. Incidentally, means for replenishing the developer with a replenishment solution is provided in the developer tank 4.

The rinsing zone B is provided for washing the developer deposited on the photosensitive planographic printing plate 1, and it is constituted by two pairs of carrying rollers 12a and 12b, spray nozzles 13 for spraying a washing solution, a washing solution tank 14, a pump P2 for sucking up the washing solution reserved in the washing solution tank 14 to thereby supply the pressurized washing solution to the spray nozzles 13, a piping system 15, a brush roller 42 slidably touching the image surface of the photosensitive planographic printing plate 1 and rotating in a forward direction or in a backward direction, and the like. Incidentally, means for replenishing the washing solution is provided in the washing solution tank 14.

The gum solution applying zone C which is provided for applying a gum solution for protecting the printing surface of the photosensitive planographic printing plate 1, is constituted by two pairs of carrying rollers 22a and 22b, spray nozzles 23 for spraying the gum solution, a gum solution tank 24, a pump P3 for sucking up the gum solution reserved in the gum solution tank 24 to thereby supply the pressurized gum solution to the spray nozzles 23, a piping system 25, and the like. Incidentally, means for replenishing the gum solution is provided in the gum solution tank 24.

In the most downstream portion of each of the zones, the photosensitive planographic printing plate 1 is nipped between a pair of rollers so that the solution is prevented from being brought into the next step.

The drying apparatus D which is provided for drying the gum solution applied onto the photosensitive planographic printing plate 1, is substantially designed so that the photosensitive planographic printing plate 1 is dried by warm air while carried by flower pattern comb rollers 6a and 6b. In the drying apparatus D, warm air ducts 31 are provided so as to blow warm air against the upper and lower side surfaces of the photosensitive planographic printing plate 1. As shown in FIGS. 5 and 6, the warm air ducts 31 are formed so that heat generated from a heater 32 is circulated in the warm air ducts 31 by a fan 33. Further, molleton rollers (solution-absorbing rollers) 34a and 34b for wiping off the gum solution are provided on the most downstream side of the drying apparatus D, that is, at an end for discharging the photosensitive planographic printing plate 1.

Incidentally, each of the rollers 2a, 2b, 12a, 12b, 22a and 22b touches the widthwise whole surface of the photosensitive planographic printing plate 1 but, as shown in FIG. 7, each of the flower pattern comb rollers 6a and 6b has a structure which is such that a portion touching the planographic printing plate 1 is minimized as much as possible.

In the developing zone A, the developer is applied onto the photosensitive planographic printing plate 1 having an image formed by an electrophotographic technique, so that the non-image portion is dissolved and removed. Then, the photosensitive planographic printing plate is washed with water in the rinsing zone B. Then, the gum solution for protecting the surface of the printing plate is applied in the gum solution applying zone C.

Next, the printing plate is dried by warm air in the drying apparatus D and then discharged. The following problems have become clear with respect to the application of the gum solution.

Because the gum solution is applied while the photosensitive planographic printing plate 1 is nipped and carried by the two pairs of carrying rollers 22a and 22b, the gum solution ought to be applied uniformly onto the whole surface thereof naturally. According to examination by the inventor of the present application, however, it has become clear that the gum solution is substantially uniformly applied onto the image-forming portion in a range represented by the broken line in FIG. 7 but coating irregularities occur in the peripheral portion outside of the broken line.

Explaining the contents of the coating irregularities more in detail, the quantity of coating on the rear end portion 1b of the photosensitive planographic printing plate 1 becomes larger than the quantity of coating on the front end portion 1a thereof in the carrying direction of the photosensitive planographic printing plate 1 as shown in FIG. 8 and, further, the quantities of coating on the opposite end portions 1c and 1d in the widthwise direction become larger as shown in FIG. 9. Further, the occurrence of coating irregularities on the opposite end portions 1c and 1d may be considered as follows.

That is, there is some case where an aluminum plate, for example, having a thickness of not smaller than 0.1 mm is used as the photosensitive planographic printing plate 1. On the other hand, the carrying rollers 22a and 22b are formed from rubber (EPT, silicon rubber, etc.) so as to be soft to the photosensitive planographic printing plate 1. Accordingly, in a state in which the photosensitive planographic printing plate 1 is nipped by the carrying rollers 22a and 22b, it is thought of that gaps g are formed on opposite sides as shown in FIG. 10 and that the gum solution remaining in the gaps g is deposited on the widthwise opposite end portions 1c and 1d of the photosensitive planographic printing plate 1 to thereby bring about coating irregularities.

Although the coating irregularities, state of the photosensitive planographic printing plate 1 and the cause thereof have been elucidated as mentioned above, the photosensitive planographic printing plate 1 is conventionally used upon the assumption that there is no obstacle to its function as a printing plate because substantially uniform coating is performed on the image-forming portion. It has, however, become clear that various problems are caused by the coating irregularities in the case where a drying process following the gum solution applying process is taken into account.

That is, because the coating irregularities is a state in which the gum solution is applied so as to be partially thick, a longer time is required for drying compared with the image-forming portion onto which the gum solution is applied uniformly. On the other hand, each of the molleton rollers 34a and 34b is formed by winding a material having an excellent water-absorbing property and water-holding property, such as sponge, felt, etc., on a metal roller, but there is conventionally a preconception that the molleton rollers had better be kept contactless unless the whole surface of the photosensitive planographic printing plate 1 is dried. Because the drying of the coating irregularities portion lags, the molleton rollers come into contact with the photosensitive planographic printing plate 1 after the running of the photosensitive planographic printing plate 1 to some degree, that is, after increasing the running distance, or increasing heater power to ensure that the molleton rollers 34a and 34b are to be brought into contact with the photosensitive planographic printing plate 1 after the whole surface thereof is dried.

Accordingly, the conventional drying apparatus D is large-sized as the whole and, furthermore, there arise various problems such as that electric power consumption is increased, that a long time is required for the drying process, and the like.

SUMMARY OF THE INVENTION

It is an object of the present invention to provide a miniaturized printing plate drying apparatus capable of rapidly drying a printing plate without an increase of heater power.

In order to accomplish the above object, the printing plate drying apparatus includes carrying devices such as flower pattern comb rollers which carry a printing plate having a printing surface including an image-formed portion and a non-image-formed portion, the printing surface being applied with a coating solution; a first warm air duct which blows warm air to dry the printing surface of the printing plate on which the coating solution is applied; a first solution-absorbing roller which touches the printing surface of the printing plate dried by the first warm air duct to absorb the solution therefrom; and a second warm air duct which blows warm air to dry the printing surface of the printing plate form which the solution is absorbed by the first solution-absorbing roller.

In the present invention, drying is performed contactlessly by warm air ducts in a stage where an image-forming portion concerned with printing is not yet dried, and coating irregularities on a non-image-forming portion are solution-absorbed by solution-absorbing rollers in a stage where the image-forming portion is dried but the non-image-forming portion is not yet dried. Accordingly, since the drying of the whole surface of the printing plate is accelerated without an increase of heater power so that the carrying distance for drying the printing plate can be shortened, reduction of the length in the direction of the carrying and reduction of the size of the drying apparatus can be attained.

BRIEF DESCRIPTION OF THE DRAWINGS

In the accompanying drawings.

DETAILED DESCRIPTION OF THE INVENTION

Figure 1:
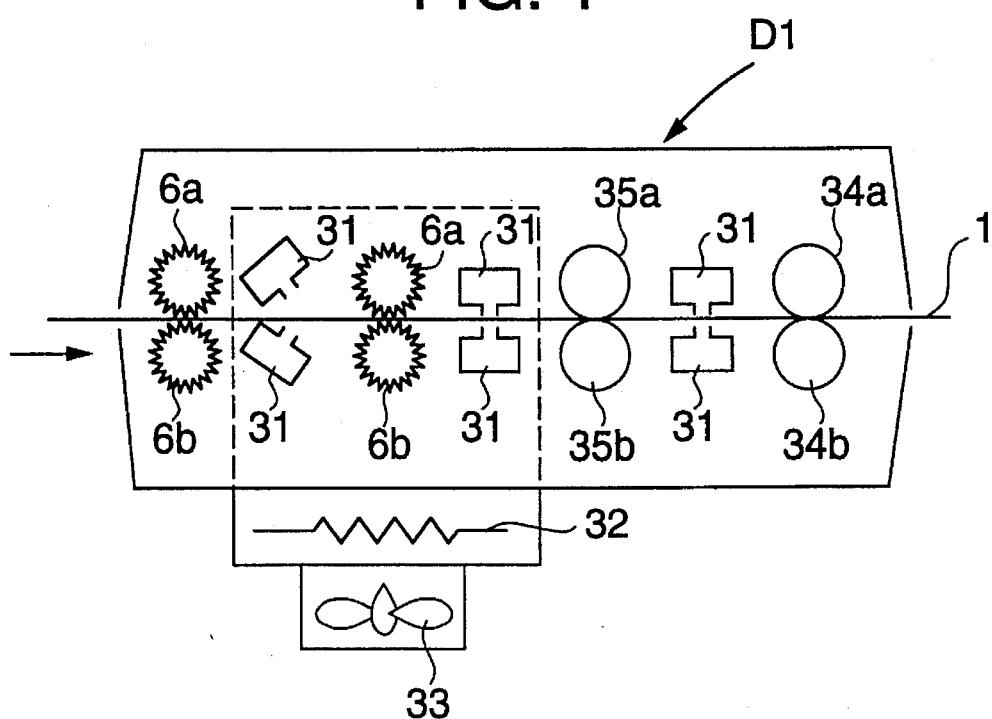
FIG. 1 is a schematic configuration diagram showing the configuration of a drying apparatus for a photosensitive planographic printing plate which is a first embodiment of the present invention.

As examples of the printing plate in the present invention, there are a photosensitive planographic printing plate (PS plate), an anhydrous PS plate, an electrophotographic direct planographic printing plate, an electrophotographic paper master (EPL), etc.

As examples of a supporting material for supporting the photosensitive planographic printing plate, an aluminum plate, a zinc plate, an iron plate, a paper plate, a plastic plate, etc. may be used, and preferably, the thickness thereof may be selected to be 0.1 mm, 0.15 mm, 0.24 mm, 0.3 mm, etc. Image formation may be applied to a single surface or may be applied to both the opposite surfaces.

As the carrying rollers used in the present invention, rollers having elasticity are used preferably. Examples of the material for the carrying rollers are rubber (EPT, silicon rubber, etc.), sponge, synthetic fiber (for example, CLARINO (trade name)), felt, and the like.

Examples of the coating solution in the present invention are a finisher solution, a gum solution, a dyeing solution for anhydrous PS plate, an etching solution for electrophotographic paper master, and the like.

A surface affinitizing solution described in Japanese Patent Unexamined Publication No. Sho-51-34001 and a material described in Japanese Patent Unexamined Publication No. Hei-4-43362 can be used in the present invention.

The coating quantity of the coating solution in the present invention is preferably in a range of from 0.5 ml/m$^2$ to 10 ml/m$^2$, more preferably in a range of from 1 ml/m$^2$ to 4 ml/m$^2$. The viscosity of the coating solution is preferably in a range of from 1 cp to 100 cp, more preferably in a range of from 5 cp to 50 cp. When the coating quantity is in a range of from 1 ml/m$^2$ to 4 ml/m$^2$ the positions where the solution-absorbing rollers are provided are preferably distant by a range of from 5 cm to 21 cm from the starting portion of the drying zone.

Drying is performed in a drying chamber by blowing warm air into the drying chamber. The temperature of the inside of the drying chamber is preferably in a range of 40° C. to 100° C.

As examples of the material for surfaces of the solution-absorbing rollers, there can be used molleton (cotton, mixed fiber spinning of cotton and synthetic fiber), felt (wool, synthetic fiber), paper fabric (natural fiber, synthetic fiber), synthetic leather (CLARINO (trade name)), and the like.

The electrophotographic planographic printing plate which can be treated in accordance with the present invention can be produced by a conventionally known method.

That is, after an electrophotographic planographic printing raw plate is processed in a dark place and loaded into an electrification portion, the printing raw plate is electrified substantially uniformly and an electrostatic latent image is formed by image exposure. Examples of a method of exposure are: scanning exposure using semiconductor laser, He-Ne laser, or the like; reflection image exposure using xenon lamp, tungsten lamp, fluorescent lamp, or the like, as a light source; contact exposure through a transparent positive film; and the like.

The aforementioned electrostatic latent image is then developed by toner. As a developing method, there can be used a conventionally known method selected from various methods such as cascade development, magnetic brush development, powder cloud development, solution development, etc. Especially, solution development is suitable for generating a printing plate because a delicate image can be formed. Further, there can be used either positive development method in which toner is deposited onto a non-exposure portion or reversing development method in which toner is deposited onto an exposure portion. The toner image thus formed can be fixed by a known fixing method such as thermal fixing, pressure fixing, solvent fixing, or the like.

While the thus formed toner image is made to act as a resist, an electrophotographic photosensitive layer of the non-image portion is removed by an eluate to thereby make it possible to generate a planographic printing plate.

In accordance with necessity for this plate-making process, a cooling portion may be provided as an after-process posterior to the toner fixing portion; a rinsing portion, a water-washing portion, a gumming portion, a drying portion, a plate detecting portion capable of pattern recognition and provided with a CCD sensor, or the like, a vender and punch portion for processing a printing plate into a predetermined shape, a plate accumulation portion; or a process for removing toner deposited onto a printing plate end portion, etc. may be provided as an after-process posterior to the eluting process.

In the following, the electrophotographic planographic printing raw plate which can be treated in accordance with the present invention will be described.

Various types of supports can be used as an electrically conductive substrate for the electrophotographic printing raw plate. There can be used electrically conductive substrates having hydrophilic surfaces, for example, a plastic sheet having an electrically conductive surface, a sheet of paper particularly made to be impermeable to solvent and electrically conductive, an aluminum plate, a zinc plate, bimetal plates such as a copper-aluminum plate, a copper-stainless steel plate, a chrome-copper plate, etc., trimetal plates such as a chrome-copper-aluminum plate, a chrome-lead-iron plate, a chrome-copper-stainless steel plate, etc., and the like. The thickness of the electrically conductive substrate is selected to be preferably in a range of from 0.1 to 3 mm, more preferably in a range of from 0.1 to 0.5 mm. Of these substrates, an aluminum plate is used preferably.

The aluminum plate adapted to the electrophotographic printing raw plate is a plate-like matter of pure aluminum, an aluminum alloy, or the like, containing aluminum as a main component and a very small amount of different atoms. Because the composition of the aluminum plate is not specified, conventionally known and available materials can be used suitably.

This aluminum plate may be grained or anodically oxidized by a conventionally known method before it is used. To remove roll grease from the surface of the aluminum plate before graining treatment, degreasing treatment using a surface active agent or an alkaline aqueous solution is applied as occasion demands before graining treatment is applied. As the graining treatment method, there are a method in which the surface is roughened mechanically, a method in which the surface is dissolved electrochemically, and a method in which the surface is dissolved chemically and selectively. As the mechanically surface roughening method, there can be used known methods called ball-polishing method, brush-polishing method, blast-polishing method, buff-polishing method, etc. Further, as the electrochemically surface roughening method, there is a method in which roughening is performed by alternating current or direct current in an electrolytic solution of hydrochloric acid or nitric acid. Further, as disclosed in Japanese Patent Unexamined Publication No. Sho-54-63902, a method obtained by combining the two methods can be used.

The roughened aluminum plate is subjected to alkali-etching treatment and neutralizing treatment as occasion demands.

The aluminum plate thus treated is subjected to anodic oxidation treatment. As an electrolyte used in the anodic oxidation treatment, sulfuric acid, phosphoric acid, oxalic acid, chromic acid or mixed acid thereof is used. Those electrolytes and concentrations thereof are decided based on the type of the electrolytes. The condition for the anodic oxidation treatment cannot be specified unconditionally because the condition varies based on the electrolyte used, but the condition is generally suitable when the concentration of electrolyte is in a range of from 1 to 80% by weight as solution, solution temperature is in a range of from 5° to 70° C., current density is in a range of from 5 to 60 A/dm$^2$, voltage is in a range of from 1 to 100 V, and electrolysis time is in a range of from 10 seconds to 50 minutes. The quantity of anodically oxidized film is preferably in a range of from 0.1 to 10 g/m$^2$, more preferably in a range of from 1 to 6 g/m$^2$. The thickness of each of these aluminum plates is preferably in a range of from 0.1 to 3 mm, more preferably in a range of from 0.1 to 0.5 mm.

Further, a material obtained by anodically oxidizing an aluminum plate and then soaking the aluminum plate in an aqueous solution of alkali-metal silicate, may be use as described in Japanese Patent Examined Publication No. Sho- 47-5125. Further, electrodeposition of silicate as described in the specification of U.S. Pat. No. 3,658,662 is useful. Treatment using polyvinyl sulfonate as described in the specification of German Federal Republic Pat. No. 1,621,478 is also suitable.

As photoconductive material, there can be used various compounds which are known conventionally. Examples of the photoconductive material include triazole derivatives, oxadiazole derivatives, imidazole derivatives, polyarylalkane derivatives, pyrazoline derivatives, pyrazolone derivatives, phenylenediamine derivatives, arylamine derivatives, aminated calcon derivatives, N,N-bicarbazyl derivatives, oxazole derivatives, styrylanthracene derivatives, fluorenone derivatives, hydrazone derivatives, benzidine derivatives, stilbene derivatives, etc.

Besides the aforementioned low-molecular photoconductive compounds, there may be also used high-molecular compounds as follows. Examples of the high-molecular compounds include: vinyl copolymers such as polyvinyl carbazole and derivatives thereof, polyvinyl pyrene, polyvinyl anthracen, poly-2-vinyl-4-(4'-dimethylaminophenyl)-5-phenyloxazole,poly-3-vinyl-N-ethylcarbazole, etc.; polymers such as polyacenaphthylene, polyindene, acenaphthylene-styrene copolymer, etc.; condensed resins such as pyrene-formaldehyde resin, bromopyrene-fomaldehyde resin, ethylcarbazole-formaldehyde resin, etc.; and the like.

Further, various kinds of pigments, sensitizing dyes, etc. can be used for the purpose of improvement of the sensitivity of the photoconductor, provision of a desired photosensitive wavelength band, and the like. Examples of these include: monoazo, bisazo and trisazo pigments; phthalocyanine pigments such as metal phthalocyanine, nonmetal phrhalocyanine, naphthalocyanine, etc. having various types of crystalline structures such as α, β, ε, τ, x and T type structures, etc.; perylene pigments; indigo and thioindigo derivatives; quinacridone pigments; polycyclic quinone pigments; bisbenzimidazole pigments; squalium salt pigments; azulenium salt pigments; and the like.

Further, as the sensitizing dyes, there can be used known compounds described in "Sensitizer", page 125, Kodan-Sha (1987); "Electrophotograph", Vol. 12, page 9 (1973); "Organosynthetic Chemistry", Vol. 24, No. 11, page 1010 (1966); and the like. Examples of the sensitizing dyes include pyrilium dyes, triarylmethane dyes, cyanine dyes, styryl dyes, and the like.

For the purpose of improvement of sensitivity, or the like, electron attractive compounds such as trinitrofluorenone, chloranil, tetracyanoethylene, etc. can be used in the photoconductive layer.

The above materials may be used singly or in combination of two or more. Further, when an electric charge generating agent has not only electric charge generating ability but also electric charge transporting ability, a photosensitive material can be composed by dispersively applying the electric charge generating agent as a basic material into a binder. That is, an organic photoconductive compound known as an electric charge transporting agent need not always be used in combination with the electronic charge generating agent. Further, the photoconductive layer may be formed into a monolayer shape or into a multilayer lamination shape as occasion demands.

As long as the non-image portion can be removed by the aforementioned eluate after toner development, a binding resin used in the electrophotographic planographic printing raw plate is not limited specifically but can be illustrated by way of example as follows.

That is, there can be preferably used a copolymer of styrene, (meth)acrylic ester, vinyl acetate, or the like, and a monomer containing carboxylic acid or acid anhydride group such as (meth)acrylic acid, itaconic acid, crotonic acid, maleic acid, maleic acid anhydride, maleic anhydride monoalkyl ester, fumaric acid, etc. Specifically, there can be shown: styrene/maleic acid anhydride copolymer; styrene/maleic anhydride monoalkyl ester copolymer (meth)acrylic acid/(meth)acrylic ester copolymer; styrene/(meth)acrylic acid/(meth)acrylic ester copolymer; vinyl acetate/crotonic acid copolymer; vinyl acetate/crotonic acid/(meth)acrylic ester copolymer; vinyl acetate/vinyl ester of carboxylic acid having 2 to 18 carbons/crotonic acid copolymer; and the like.

Further, there can be used a copolymer containing a monomer having (meth)acrylic amido, vinylpyrrolidone, phenolic hydroxyl group, sulfonic group, sulfonamide group, sulfonimide group, etc.

Further, there can be used: novolak resin obtained by condensing phenol, o-cresol, m-cresol or p-cresol and formaldehyde or acetaldehyde; partially saponified vinyl acetate resin; polyvinylacetal resin such as polyvinylbutyral, etc.; polyurethane resin having carboxylic acid; and the like.

Of these, a copolymer of (meth)acrylic ester, styrene, vinyl acetate, or the like, and a monomer containing carboxylic acid such as (meth)acrylic acid, etc. is particularly excellent in electrophotographic property, eluting property, printing aptitude, etc., so that the copolymer can be used preferably.

More preferably, there can be used a copolymer of (meth)acrylic ester of aliphatic or aromatic alcohol such as methyl alcohol, ethyl alcohol, propyl alcohol, isopropyl alcohol, butyl alcohol, isobutyl alcohol, sec-butyl alcohol, tert-butyl alcohol, n-amyl alcohol, isoamyl alcohol, hexyl alcohol, octyl alcohol, benzyl alcohol, phenethyl alcohol, etc. and (meth)acrylic acid.

The electrophotographic planographic printing raw plate is obtained by applying a photoconductive layer onto an aluminum substrate in accordance with an ordinary method. As for the generation of the photoconductive layer, there is known: a method in which constituent parts of the photoconductive layer are made to be contained in one and the same layer; a method in which an electric charge carrier generating substance and an electric charge carrier transporting substance are used so as to be separated into different layers; or the like. The photoconductive layer can be generated by any method. The coating solution is generated by dissolving respective constituent parts of the photoconductive layer in a suitable solvent. When components insoluble to the solvent, such as a pigment, etc., are to be used, the components are used so as to be dispersed in the form of grain size of not larger than 5 μm by a disperser such as a ball mill, a paint shaker, a Dyno-Mill, an attriter, or the like. The binding resin and other additive agents used in the photoconductive layer may be added when or after the pigment, or the like is dispersed. The coating solution thus generated is applied onto a substrate by a known method such as rotation coating, blade coating, knife coating, reverse roll coating, dip coating, rod bar coating or spray coating, and dried, so that the electrophotographic planographic printing raw plate can be obtained.

Examples of solvent used for composing the coating solution include: hydrocarbon halides such as dichloromethane, dichloroethane, chloroform, etc.; alcohols such as methanol, ethanol, etc.; ketones such as acetone, methylethyl ketone, cyclohexanone, etc.; glycol ethers such as ethylene glycol monomethyl ether, 2-methoxyethyl acetate, etc.; propylene glycols such as propylene glycol monomethyl ether, propylene glycol monomethyl ether acetate, etc.; ethers such as tetrahydrofuran, dioxane, etc.; esters such as ethyl acetate, butyl acetate, etc.; and the like.

Besides the photoconductive compound and the binding resin, various kinds of additive agents such as plasticizer, surface active agent, matting agent, etc., may be added to the photoconductive layer for the purpose of improvement in elasticity and coating surface shape of the photoconductive layer, or the like, as occasion demands. These additive agents can be contained in the photoconductive layer as long as the electrostatic characteristic and eluting property of the photoconductive layer are not deteriorated.

Further, if the film thickness of the photoconductive layer is too small, surface potential necessary for development cannot be supplied. On the contrary, if the thickness is too large, side etching occurs easily so that a good printing plate cannot be obtained. The film thickness of the photoconductive layer is selected to be in a range of from 0.1 to 30 μm, preferably in a range of from 0.5 to 10 μm.

As for the respective amounts of the binding resin and photoconductive compound contained in the photoconductive layer, the photoconductive compound is used to be preferably in a range of from 0.02 part by weight to 1.2 part by weight per 1 part by weight of the binding resin, more preferably in a range of from 0.05 part by weight to 1.0 part by weight per 1 part by weight of the binding resin, because sensitivity is lowered if the amount of the photoconductive compound contained in the photoconductive layer is small.

In the electrophotographic planographic printing raw plate, an intermediate layer may be provided for the purpose of improvement in adhesion between the aforementioned aluminum substrate and the photoconductive layer, electrical characteristic, eluting property and printing characteristic of the photoconductive layer, or the like, as occasion demands.

Although the above description has been made concerning a printing raw plate mainly using an organic photoconductive substance, a zinc oxide type printing raw plate generally used for light printing, or the like can be used in the same manner as described above.

A photosensitive material can be produced by cutting the thus generated printing raw plate into a predetermined size and then laminating the cut parts with one another in accordance with a known method.

A gum solution used in the present invention contains a high-molecular compound, a lipophilic substance, a surface active agent, and water.

Examples of natural high-molecules include: starches such as sweet potato starch, white potato starch, tapioca starch, wheat starch, corn starch, etc.; matters derived from Algae, such as carrageenan, laminarin, marine algae mannan, funorin, Irish moss, agar, sodium alginate, etc.; vegetable mucilage such as hibiscus, mannan, quince seed, pectin, tragacanth gum, karaya gum, xanthine gum, guar bean gum, locust bean gum, arabic gum, carob gum, benzoin gum, etc.; microbial mucilage such as homopolysaccharides such as dextran, glucan, levan, etc., heteropolysaccharides such as succinoglucan, xanthan gum, etc., and the like; protein such as glue, gelatin, casein, collagen, etc.; and the like.

Examples of seminatural substances (semisynthetic substances) include, besides propylene glycol alginate ester, cellulose derivatives and processed starches, such as viscose, methyl cellulose, ethyl cellulose, methylethyl cellulose, hydroxyethyl cellulose, carboxymethyl cellulose, hydroxypropyl cellulose, hydroxypropylmethyl cellulose, hydroxypropylethyl cellulose, hydroxypropylmethyl cellulose phthalate, etc., and the like.

Examples of the processed starches include: roasted starches such as white dextrin, yellow dextrin, British gum, etc.; enzyme-denatured dextrins such as enzyme dextrin, etc.; acid-decomposed starches such as solubilized starch; oxidized starches such dialdehyde starch, alpha-starch such as denatured alpha-starch, non-denatured alpha-starch, etc.; esterified starches such as starch phosphate, fatty starch, starch sulfate, starch nitrate, starch xanthogenate, starch carbamate, etc.; etherized starches such as carboxyalkyl starch, hydroxyalkyl starch, sulfoalkyl starch, cyanoethyl starch, allyl starch, benzyl starch, carbamylethyl starch, dialkylamino starch, etc.; cross-linkage starches such as methylol-cross-linkage starch, hydroxyalkyl-cross-linkage starch, phosphate-cross-linkage starch, dicarboxylate-cross-linkage starch, etc.; starch graft copolymers such as starch-polyacrylamide copolymer, starch-polyacrylic acid copolymer, starch-polyvinyl acetate copolymer, starch-polyacrylonitrile copolymer, cationic starch-polyacrylic ester copolymer, cationic starch-vinyl polymer copolymer, starch-polystyrene maleate copolymer, starch-polyethylene oxide copolymer, etc.; and the like.

Examples of synthetic substances include: denatured polyvinyl alcohols such as acetalized polyvinyl alcohol, allylated polyvinyl alcohol, polyvinyl methyl ether, polyvinyl ethyl ether, polyvinyl isobutyl ether, etc.; polyacrylic acid derivatives and polymethacrylic acid derivatives, such as sodium polyacrylate, partial saponified polyacrylic ester, partial saponified polyacrylic ester copolymer, polymethacrylate, polyacrylamide, etc.; polyethylene glycol; polyethylene oxide; polyvinylpyrrolidone; vinylpyrrolidone-vinyl acetate copolymer; carboxyvinyl polymer; styrol-maleic acid copolymer; styrol-crotonic acid copolymer; etc. Of these, substances derived from Algae, vegetable mucilage, cellulose derivatives, processed starches, propylene glycol alginate ester and synthetic substances are used preferably because they have property in which coating film is formed on the printing plate well.

Examples of the lipophilic substance include plasticizer, fatty acid, fatty oil, monohydric alcohol, wax, and lipophilic resin used as a vehicle for planographic printing ink. As preferred examples of the lipophilic resin, there can be shown: novolak type phenol resins such as phenolformaldehyde resin, cresolformaldehyde resin, t-butylphenolformaldehyde resin, etc.; xylene resin obtained by condensing phenol and xylene with formaldehyde; resin obtained by condensing phenol and mesitylene with formaldehyde; brominated polyhydroxystyrene; cashew resin; partially esterified copolymer of styrene and maleic acid anhydride; melamine resin; alkyd resin; polyester resin; epoxy resin; rosin; denatured rosin such as hydrogeneted rosin, rosin ester, etc.; and petroleum resins such as gilsonite, etc.

Preferred examples of the plasticizer include: phthalic diesters such as dibutyl phthalate, di-n-octyl phthalate, di-(2-ethylhexyl) phthalate, dinonyl phthalate, didecyl phthalate, dilauryl phthalate, butylbenzyl phthalate, etc.; aliphatic dibasic acid esters such as dioctyl azelate, dioctyl adipate, dibutyl glycol adipate, dibutyl sebacate, di-(2-ethylhexyl) sebacate, dioctyl sebacate, etc.; epoxidized triglycerides such as epoxidized soybean oil, etc.; phosphoric esters such as tricresyl phosphate, trioctyl phosphate, trischlorethyl phosphate, etc.; and benzoic esters such as benzyl benzoate, etc. Preferred examples of the fatty acid include: saturated fatty acids such as caproic acid, enanthic acid, caprylic acid, pelargonic acid, capric acid, undecylic acid, lauric acid, tridecylic acid, myristic acid, pentadecylic acid, palmitic acid, heptadecylic acid, stearic acid, nonadecanoic acid, arachic acid, behenic acid, lignoceric acid, cerotic acid, heptacosanic acid, montanic acid, melissic acid, lacceric acid, isovaleric acid, etc.; and unsaturated fatty acids such as acrylic acid, crotonic acid, isocrotonic acid, undecylenic acid, oleic acid, elaidic acid, cetoleic acid, erucic acid, brassidic acid, sorbic acid, linolic acid, linolenic acid, arachidonic acid, propiolic acid, stearolic acid, clupanodonic acid, tariric acid, licanic acid, etc. The monohydric alcohol is classified into aliphatic saturated monohydric alcohol, aliphatic unsaturated monohydric alcohol, aromatic alcohol, alicyclic alcohol, heterocyclic alcohol, etc. Further, the monohydric alcohol may have substituent. Examples of the substituent include: halogen atom such as chlorine or bromine; alkoxy group such as methoxy or propoxy; aryloxy group such phenoxy; and the like.

In the present invention, a solution gum solution or any one of emulsion gum solution, suspension gum solution, non-emulsion non-suspension gum solution, etc. obtained by selecting surfaceactive agents, lipophilic substances, and the like, are preferably used.

The PS plate used in the present invention is a plate in which a photosensitive layer having solubility changed, for example, by light radiation is applied by a thickness of from 5 to 0.1 g/m² onto a substrate such as an aluminum plate, a zinc plate, an iron plate, a paper plate, a plastic plate, or the like. As the photosensitive layer, there can be shown photosensitive layers made of orthoquinone diazide compounds, diazonium salt compounds, azide compounds, photopolymer compounds, photopolymerization compounds, etc., respectively.

Particularly, optimum examples of the PS plate adapted to the present invention are a positive type PS plate having a photosensitive layer made from an orthoquinone diazide component on an aluminum plate, and a negative type PS plate having a photosensitive layer made from a diazonium salt compound.

As the developer used in the present invention, there is used a solution by which the photosensitive layer of the PS plate is eluted or removed easily. When, for example, the photosensitive layer is made of an orthoquinone diazide compound, an aqueous solution of sodium silicate or potassium silicate is used as the developer. Further, in the case where the developer is used for a long term as occasion demands, a development replenisher is supplied. As the development replenisher supplied in this case, there is used a developer higher in alkalinity than the original developer, as described in Japanese Patent Unexamined Publication Nos. Sho-50-144502 and Sho-54-62004. The quantity of replenishment varies correspondingly to the strength of the supplemented development replenisher but it is proper from easiness of management that one dose of replenishment is selected to be in a range of from 5 ml to 5 liters per 20 liters of the quantity of the developer prepared in advance. The dose of replenishment for best management is selected to be in a range of from 20 ml to 2 liters per 20 liters of the quantity of the developer prepared in advance.

In the case where the photosensitive layer is made of a negative type diazonium compound so that a part thereof subjected to light exposure is hardened, the composition of the developer varies widely correspondingly to the binder used in the photosensitive layer. When, for example, the binder is an alkali-soluble resin, the main component of the developer becomes an alkali agent. This alkali agent is consumed as the PS plate is treated, so that the activity of the developer is lowered. In such a case, the activity of the developer can be recovered by adding an alkali agent as the development replenisher. In the case where other PS plates constituted by an azide photosensitive layer, a light-cross-linkage type photosensitive resin layer and a photopolymerization type layer are treated with respective developers, components of the developers consumed due to the treatments are supplied by replenishment to thereby recover the respective activities of the developers.

Figure 2:
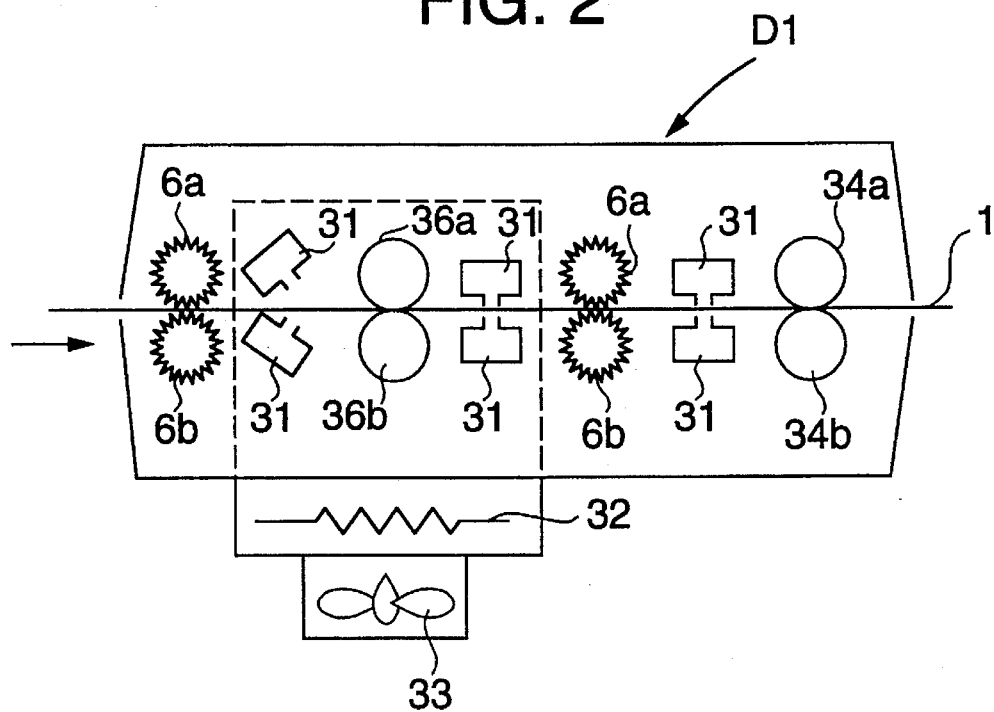
FIG. 2 is a schematic configuration diagram showing the configuration of a drying apparatus for a photosensitive planographic printing plate which is a second embodiment of the present invention.
Figure 3:
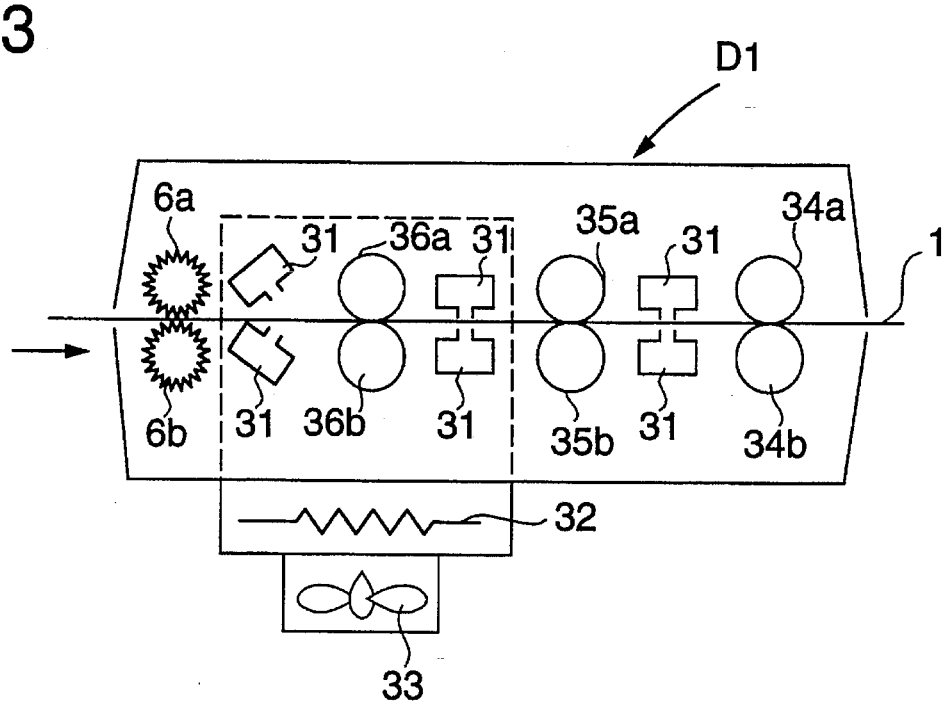
FIG. 3 is a schematic configuration diagram showing the configuration of a drying apparatus for a photosensitive planographic printing plate which is a third embodiment of the present invention.

Embodiments of a drying apparatus for photosensitive planographic printing plate to which the present invention is applied will be explained below with reference to FIGS. 1 through 3. Incidentally, FIGS. 1 to 3 are schematic configuration diagram showing respective embodiments of configuration of the drying apparatus for a photosensitive planographic printing plate according to the present invention. The same numeral is given to each member which performs the same function as that in the conventional art explained preliminarily with reference to FIG. 5, and further description of these members will be omitted.

Referring to FIG. 1, a first embodiment of the drying apparatus D1 for photosensitive planographic printing plate (hereinafter abbreviated simply as dying apparatus) will be explained. The arrangement of the upstream side of the drying apparatus D1 illustrated in this embodiment may be the same as that explained with reference to FIG. 5, and it is assumed that a photosensitive planographic printing plate 1 coated with a gum solution is carried to the drying apparatus D1 by rollers. The printing plate 1 includes an image-forming portion and a non-image-forming portion.

Flower pattern comb rollers 6a and 6b and warm air ducts 31 are arranged alternately in a place which ranges from the upstream side to the downstream side in the direction of the carrying of the photosensitive planographic printing plate 1, and molleton rollers 35a and 35b are arranged newly in the downstream side thereof. Further, warm air ducts 31 and molleton rollers 34a and 34b are provided. The molleton rollers 35a and 35b are brought into contact with the widthwise whole area of the printing plate 1.

Figure 6:
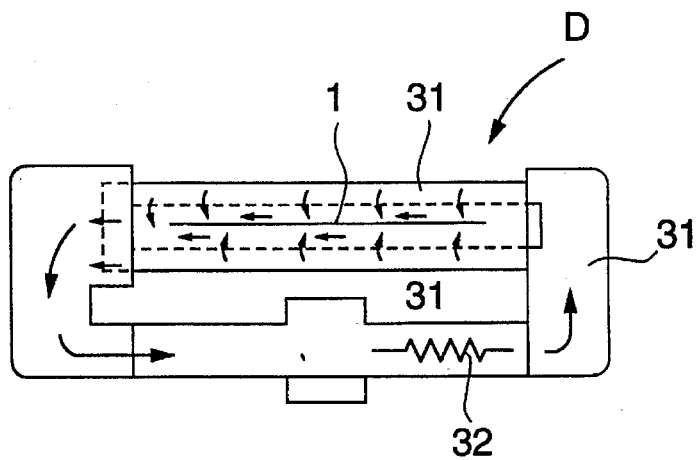
FIG. 6 is an explanatory diagram showing the configuration of a warm air duct in the dying apparatus.
Figure 7:
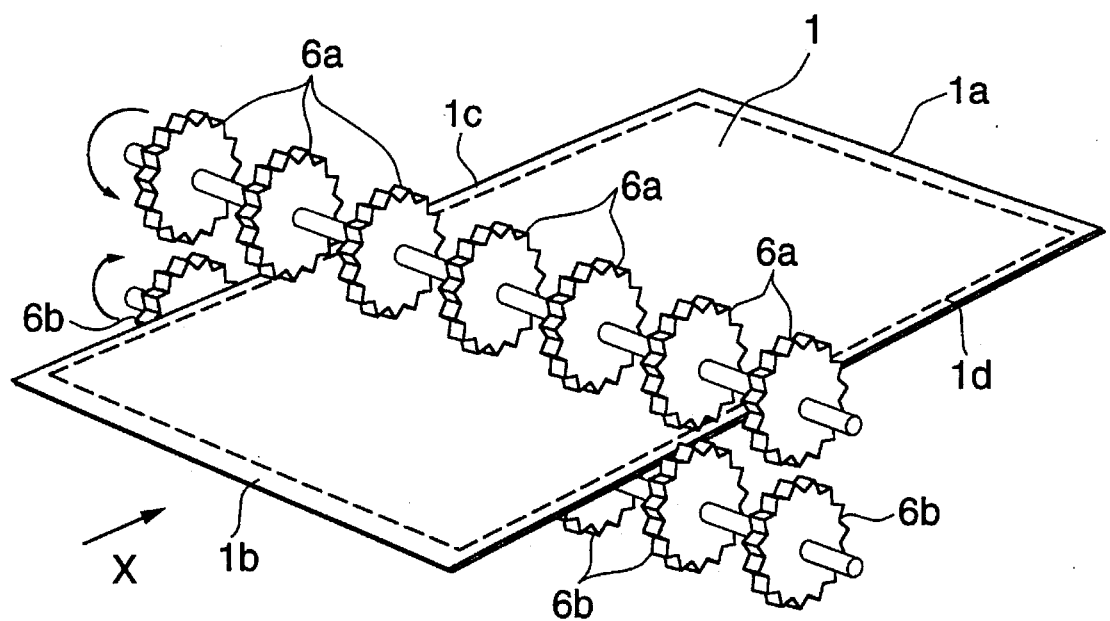
FIG. 7 is a perspective view showing the carrying of the photosensitive planographic printing plate.
Figure 8:
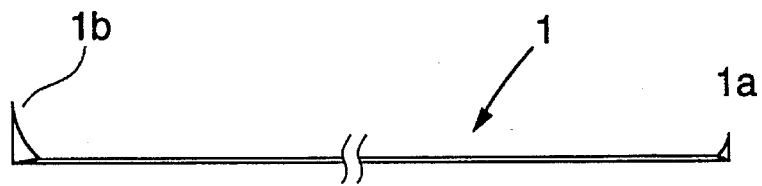
FIG. 8 is a sectional view along the direction of the carrying of the photosensitive planographic printing plate showing a state of coating irregularity.
Figure 9:
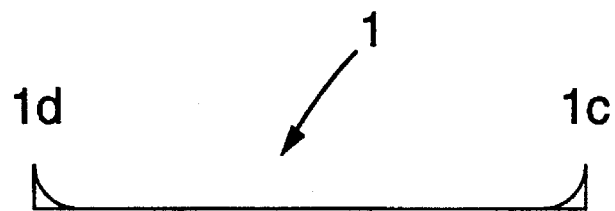
FIG. 9 is a transverse sectional view of the photosensitive planographic printing plate showing a state of coating irregularity.
Figure 10:
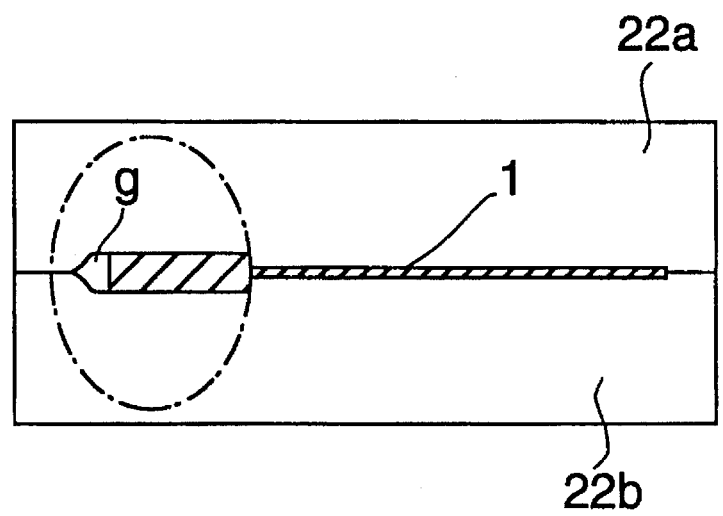
FIG. 10 is a side view of important part showing an example of formation of coating irregularities.

Incidentally, a heater 32 and a fan 33 are provided for supplying warm air to the respective warm air ducts 31 as explained preliminarily in the conventional art, and the path of circulation of warm air is as explained preliminarily with reference to FIG. 6.

Describing now structural difference from the conventional drying apparatus D, the conventional drying apparatus D has only one pair of molleton rollers 34a and 34b which are arranged in the most downstream side of the carrying path of the photosensitive planographic printing plate 1, that is, just prior to exhaust from the drying apparatus D whereas the apparatus of this embodiment further has molleton rollers 35a and 35b which are arranged in the upstream side of the molleton rollers 34a and 34b. Because the new arranged molleton rollers 35a and 35b are interposed between the second warm air duct 31 and the third warm air duct 31, the following drying acceleration function is carried out while the photosensitive planographic printing plate 1 is carried by rollers.

That is, the photosensitive planographic printing plate 1 is first dried by warm air blown against the photosensitive planographic printing plate 1 from the first and second warm air ducts 31, but the portion of any coating irregularities is not perfectly dried in this stage, that is, there is, so to speak, a difference in the degree of drying compared with the image-forming portion. The portion having a coating irregularities which is behind in drying is however solution-absorbed by the new arranged molleton rollers 35a and 35b, so that the degree of drying is made uniform. In this state, the photosensitive planographic printing plate 1 is dried by the third, that is, last warm air duct 31, solution-absorbed by the molleton rollers 34a and 34b and then discharged.

As described above, the drying apparatus D1 in this embodiment has molleton rollers 35a and 35b which are arranged in order to hasten the drying of the photosensitive planographic printing plate 1 so that solution on the whole surface of the photosensitive planographic printing plate 1 can be absorbed at a stage where the photosensitive planographic printing plate 1 has passed through the molleton rollers 35a and 35b. Accordingly, the size of the drying apparatus D1, that is, the carrying-direction length of the photosensitive planographic printing plate 1 can be reduced. Furthermore, the degree of drying can be improved without an increase of the power of the heater 32.

Hence, reduction of the lengthwise size of the drying apparatus D1 and improvement of the drying speed of the photosensitive planographic printing plate 1 can be attained.

Next, a second embodiment of the drying apparatus D1 will be described with reference to FIG. 2. Incidentally, a point of difference between this embodiment and the aforementioned first embodiment is in that molleton rollers 36a and 36b are positioned in the further upstream side.

That is, the molleton rollers 36a and 36b are arranged between the first warm air duct 31 and the second warm air duct 31 as shown in FIG. 2. Accordingly, the photosensitive planographic printing plate 1 is heated by warm air of the first warm air duct 31 but is not completely dried at this stage so that solution drops remain in the portion of any coating irregularities. In this embodiment, the solution drops remaining in the portion of any coating irregularities are averaged not only by solution absorption but also by contact with pressure because the molleton rollers 36a and 36b are arranged just at the downstream side of the first warm air duct 31.

The photosensitive planographic printing plate 1 in which the remaining solution drops have been averaged is heated by the warm air duct 31 provided just in the downstream side of the molleton rollers 36a and 36b, so that the drying thereof is accelerated. Then, the photosensitive planographic printing plate 1 is further dried by the third warm air duct 31 and further subjected to solution absorption by the molleton rollers 34a and 34b provided in the most downstream side.

Accordingly, drying the photosensitive planographic printing plate 1 can be performed efficiently without increase of the length of the drying apparatus D1 and without increase of the power of the heater 32.

Next, a third embodiment of the drying apparatus D1 will be described with reference to FIG. 3. Incidentally, a point of difference between this embodiment and the aforementioned respective embodiments is in that three sets of warm air ducts 31 and three pairs of molleton rollers 34a, 34b to 36a, 36b are arranged alternately.

According to the structure of this embodiment, the first pair of molleton rollers 36a and 36b carry out the same function as in the second embodiment upon the photosensitive planographic printing plate 1. Accordingly, even if solution drops remain in the portion of coating irregularities after the photosensitive planographic printing plate 1 has passed through the position of arrangement of the first warm air duct 31, the solution drops are absorbed and averaged by the molleton rollers 36a and 36b to a degree so that moisture is more or less left at a stage where the photosensitive planographic printing plate 1 is coming to the second warm air duct 31.

After the photosensitive planographic printing plate 1 is then dried by the second warm air duct 31, the solution in the photosensitive planographic printing plate 1 is absorbed by the molleton rollers 35a and 35b. Then, the photosensitive planographic printing plate 1 is thoroughly dried by the drying function of the third warm air duct 31 and the solution-absorbing function of the third pair of molleton rollers 34a and 34b and discharged out of the drying apparatus D1.

According to the drying apparatus D1 having the aforementioned structure, drying due to the warm air ducts 31 and solution absorption due to the molleton rollers 36a, 36b to 34a, 34b are performed alternately upon the photosensitive planographic printing plate 1 which is being carried by rollers, so that drying is accelerated.

Furthermore, because it is unnecessary to enlarge the respective distances between the warm air ducts 31 and the molleton rollers 36a, 36b to 34a, 34b, reduction of the size of the drying apparatus D1 can be attained. Further, improvement of drying efficiency can be attained without an increase of the power of the heater 32.

Figure 5:
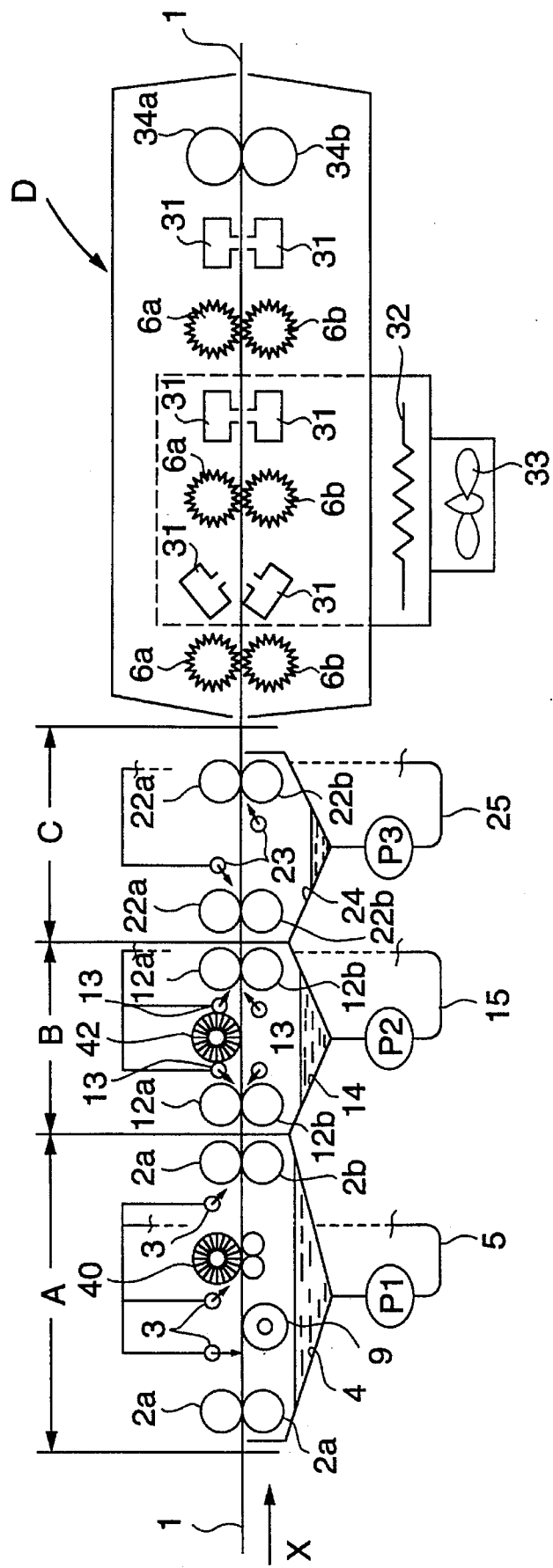
FIG. 5 is a configuration diagram of an apparatus for treating a conventional photosensitive planographic printing plate.
Figure 11:
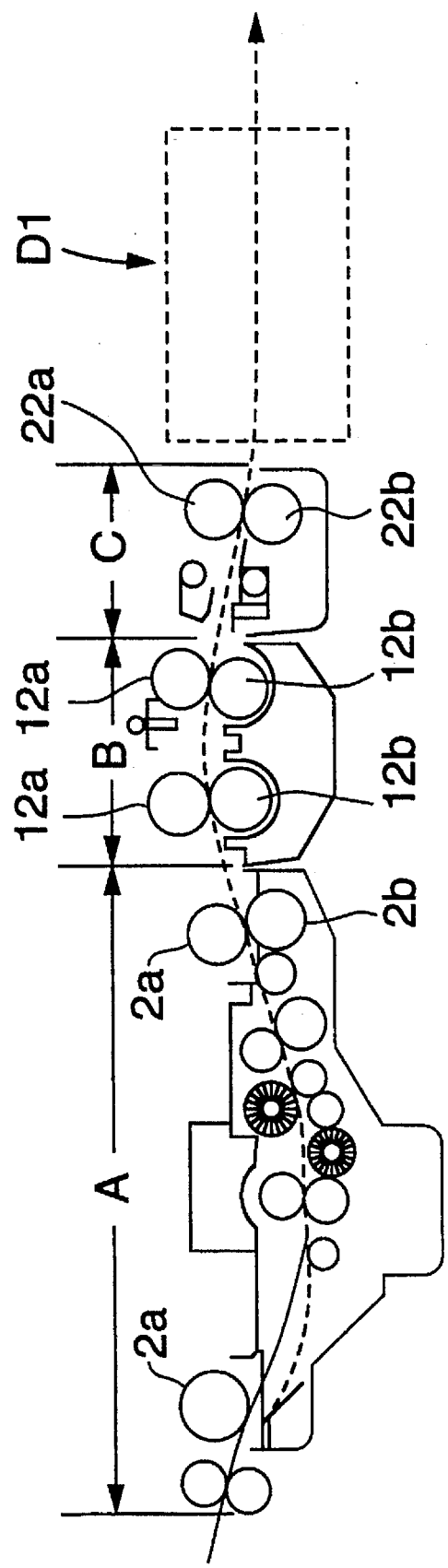
FIG. 11 is a configuration diagram of another embodiment of an apparatus for treating the photosensitive planographic printing plate.

Although the photosensitive planographic printing plate 1 is treated in the developing zone A, the rinsing zone B and the gum solution applying zone C in such a horizontal carrying system as shown in FIG. 5, the photosensitive planographic printing plate 1 may be treated in respective zones A, B and C in a structure shown in FIG. 11. In FIG. 11, like parts each having the same function as in FIG. 5 are identified by like numerals. The developing zone A shown in FIG. 11 has a structure in which the photosensitive planographic printing plate 1 is treated with a developer while soaked in the developer and carried. Further, the rinsing zone B is designed so that the photosensitive planographic printing plate 1 can be treated with a small amount of rising solution. Further, the gum solution applying zone C is designed so that even a small amount of gum solution can be applied well without waste.

Figure 4:
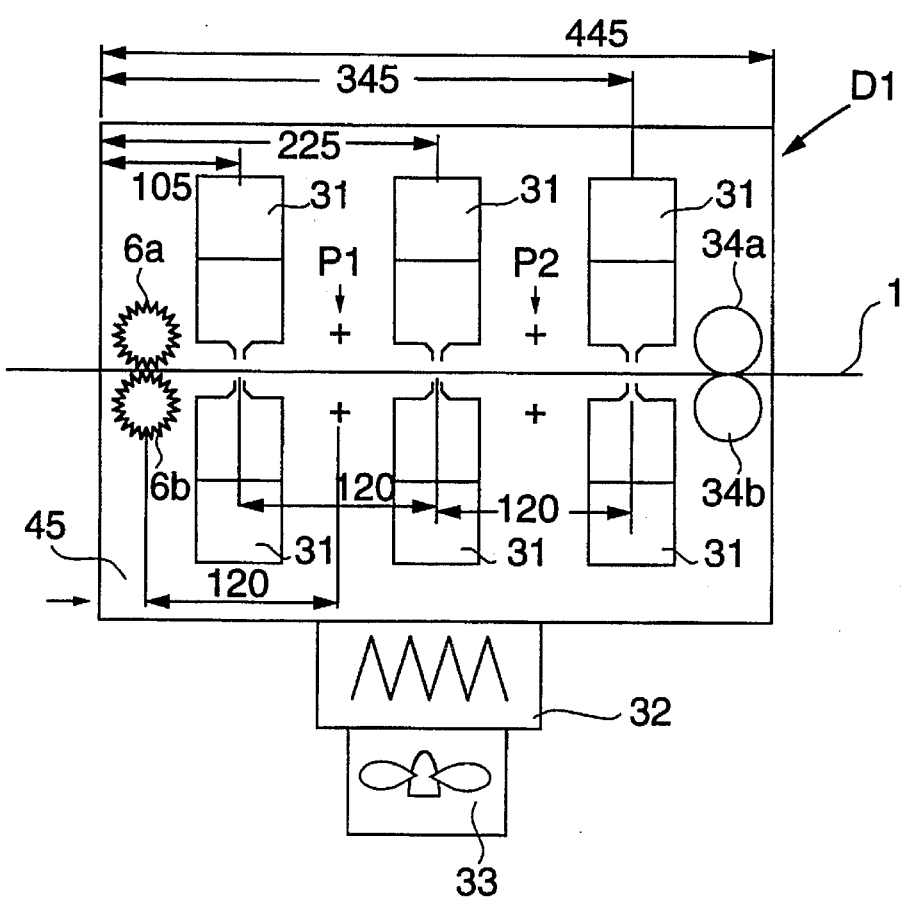
FIG. 4 is a configuration diagram of a drying apparatus for a photosensitive planographic printing plate showing an embodiment of the present invention.

An example of the drying apparatus D1 will be described below with reference to FIG. 4. Incidentally, numerical values written in FIG. 4 show sizes from the most upstream end of the drying apparatus D1, that is, from an end portion at which the photosensitive planographic printing plate 1 enters the apparatus, each of the sizes is expressed in mm. Accordingly, the length size of the drying apparatus D1 is 445 mm, and flower pattern comb rollers 6a and 6b are provided in a position 45 mm distant from the most upstream end and a first warm air duct 31 is provided in a position 105 mm distant therefrom. Likewise, a second warm air duct 31 is provided in a 225 mm-distant position and a third warm air duct 31 is provided in a 345 mm-distant position. As each of the warm air ducts 31, for example, a duct having a width wire size of 50 mm is employed.

Position P1 represents a position where molleton rollers 36a and 36b shown in the aforementioned second and third embodiments are arranged, and the size from the upstream end is set to be 165 mm. Position P2 represents a position where molleton rollers 35a and 35b shown in the aforementioned first and third embodiments are arranged, and the size from the upstream end is set to be 285 mm. Further, molleton rollers 34a and 34b are arranged in a position 405 mm distant from the upstream end.

The whole length of the drying apparatus D1 is 445 mm, and positions P1 and P2 are set to be 165 mm- and 285 mm-distant from the upstream end, respectively. Accordingly, the molleton rollers 36a, 36b, 35a and 35b are arranged so as to be located within a range of 60% of the entire length from the upstream side thereof.

In the drying apparatus D1 in this example, when flower pattern comb rollers are arranged in position P1 and molleton rollers are arranged in position P2, the function explained in the aforementioned first embodiment is carried out so that the efficiency of drying the photosensitive planographic printing plate 1 can be improved though the whole length of the drying apparatus D1 is reduced to 445 mm.

Further, when molleton rollers are arranged in position P1 and flower pattern comb rollers are arranged in position P2, the function explained in the aforementioned second embodiment is carried out so that the same effect as described above is obtained.

Further, when molleton rollers are arranged both in position P1 and in position P2, the function explained in the aforementioned third embodiment is carried out so that the same effect as described above is obtained.

Here, difference in drying state between the conventional drying apparatus D and the drying apparatus D1 according to the present invention is shown in Table 1. Incidentally, it is assumed that the drying apparatus D1 has a structure corresponding to the aforementioned third embodiment, that is, a structure in which, in addition to the molleton rollers 34a and 34b, molleton rollers are arranged in positions P1 and P2 shown in this example, and that the whole length of the drying apparatus D1 and the speed of carrying of the photosensitive planographic printing plate 1 are 450 mm or less and 5 m/min, respectively.

TABLE 1

|  | Comparative Example 1 | Comparative Example 2 | Comparative Example 3 | This Example |
| --- | --- | --- | --- | --- |
| Number of molleton rollers | 1 pair | 1 pair | 1 pair | 3 pairs |
| Speed (m/min) | 1.4 | 5 | 5 | 5 |
| Temperature (°C.) | 75 | 75 | 105 | 75 |
| Length (cm) | 20 | 70 | 45 | 45 |

As is apparent from data of Table 1, according to the drying apparatus D1 of this example, the photosensitive planographic printing plate 1 can be dried while carried at a speed of 5 m/min and the whole length thereof can be set to be 45 cm even in the case where the drying temperature is 75° C. In the conventional drying apparatus D, however, the carrying speed must be reduced to 1.4 m/min or the whole length must be enlarged to 70 cm as shown in comparative examples 1 and 2 in the case where the drying temperature is set to be 75° C.

Further, to set the whole length to the same value as in this example, the drying temperature must be set to high temperature of 105° C. as shown in the comparative example 3, so that in this occasion, electric power consumed becomes high.

Further, as for the relation between drying temperature and drying time, in the conventional drying apparatus D, the drying time is 5 seconds when the drying temperature is set to be 100° C., but in the drying apparatus D1 of this example, there are experimental data showing the fact that the drying speed can be set to be 5 seconds even if the drying temperature is set to be 70° C., or the like. As is apparent from these data, according to the structure of this example, improvement of the drying speed and reduction of the whole length of the apparatus can be performed without rising of the drying temperature.

As described above, in the drying apparatus for a printing plate according to the present invention, molleton rollers which are brought into contact with the widthwise whole area of the printing plate to thereby absorb a coating solution deposited on a non-image forming portion of the printing plate, are arranged in a position which is in a path for carrying the printing plate and on the downstream side of warm air ducts for contactlessly drying surfaces of the printing plate and to which the printing plate is carried in a state where an image-forming portion thereof is dried and the non-image-forming portion is not yet dried. Accordingly, the carrying distance for drying coating irregularities after drying due to warm air can be shortened, so that the length of the drying apparatus can be reduced correspondingly to thereby attain a reduction of the size of the drying apparatus and a reduction of drying time.

In addition, because solution-absorbing rollers are arranged in a position which is on the downstream side of the warm air ducts and at a distance of 60% or less from the upstream end of the drying apparatus, the printing plate is almost thoroughly dried in the first half of the carrying path, so that reduction of the size of the drying apparatus, saving of consumed electric power and shortening of drying time can be attained.

What is claimed is:

1. A printing plate drying apparatus comprising:

carrying means for carrying a printing plate having a printing surface including an image-formed portion and a non-image-formed portion, said printing surface being applied with a coating solution;

first drying means for blowing warm air to dry said printing surface of said printing plate on which the coating solution is applied;

first solution-absorbing means for touching said printing surface of said printing plate dried by said first drying means to absorb the solution therefrom; and second drying means for blowing warm air to dry said printing surface of said printing plate from which the solution is absorbed by said first solution-absorbing means.

2. A printing plate drying apparatus according to claim 1, further comprising second solution-absorbing means for touching said printing surface of said printing plate dried by said second drying means to absorb the solution therefrom.

3. A printing plate drying apparatus according to claim 1, further comprising third drying means for blowing warm air to dry said printing surface of said printing plate dried by said second drying means.

4. A printing plate drying apparatus according to claim 3, further comprising third solution-absorbing means for touching said printing surface of said printing plate dried by said third drying means.

5. A printing plate drying apparatus according to claim 1, further comprising:

fourth drying means for blowing warm air to dry said printing surface of said printing plate from which the solution is absorbed by said second solution-absorbing means; and fourth solution-absorbing means for touching said printing surface of said printing plate dried by said fourth drying means.

6. A printing plate drying apparatus according to claim 1, wherein said first solution-absorbing means are provided at a position within the range of 60% of the entire length from the most upstream side of said apparatus.

7. A printing plate drying apparatus according to claim 2, wherein said first solution-absorbing means and said second solution-absorbing means are provided at positions with the range of 60% of the entire length from the most upstream side of a drying path of said apparatus.

8. A printing plate drying apparatus comprising:

warm air duct means for blowing warm air to perform surface drying of a printing plate having a printing surface including an image-forming portion and a non-image-forming portion, said warm air duct means drying a uniform coating that is disposed on the image-forming portion; and solution-absorbing roller means for touching said printing surface of said printing plate to perform solution absorption, said solution-absorbing roller means being provided only at a predetermined position that is at a downstream side of said warm air duct, said predetermined position being within the range of 60% of the entire length from the most upstream side of a drying path of said apparatus, said solution absorbing roller means drying additional coating in excess of said uniform coating.

9. A printing plate drying apparatus according to claim 8, wherein there are a plurality of said solution-absorbing rollers arranged in a plurality of positions along the drying path.

10. A printing plate drying apparatus according to claim 8, wherein said solution-absorbing roller is brought into contact with the entire widthwise area of said printing plate.

* * * * *